(12) United States Patent
Pakula et al.

(10) Patent No.: US 9,105,899 B2
(45) Date of Patent: Aug. 11, 2015

(54) ELECTRONIC DEVICE SUBASSEMBLIES

(75) Inventors: David A. Pakula, San Francisco, CA (US); Emery A. Sanford, San Francisco, CA (US); Tyson B. Manullang, Sunnyvale, CA (US); Anthony S. Montevirgen, San Francisco, CA (US); Nicholas G. L. Merz, San Francisco, CA (US); Christopher M. Werner, San Jose, CA (US)

(73) Assignee: Apple Inc., Cupertino, CA (US)

( * ) Notice: Subject to any disclaimer, the term of this patent is extended or adjusted under 35 U.S.C. 154(b) by 205 days.

(21) Appl. No.: 13/607,014

(22) Filed: Sep. 7, 2012

(65) Prior Publication Data

US 2014/0071634 A1 Mar. 13, 2014

(51) Int. Cl.
| | |
|---|---|
| *H05K 7/14* | (2006.01) |
| *H01M 2/10* | (2006.01) |
| *H05K 1/02* | (2006.01) |
| *H04M 1/02* | (2006.01) |
| *H05K 9/00* | (2006.01) |

(52) U.S. Cl.
CPC .......... *H01M 2/1022* (2013.01); *H04M 1/0277* (2013.01); *H05K 1/0243* (2013.01); *H05K 9/0032* (2013.01); *H01M 2200/30* (2013.01); *H05K 2201/10371* (2013.01)

(58) Field of Classification Search
CPC .................................................... H05K 9/0062
USPC ........................................................ 361/800
See application file for complete search history.

(56) References Cited

U.S. PATENT DOCUMENTS

| | | | | |
|---|---|---|---|---|
| 5,006,779 | A | * 4/1991 | Fenne et al. | 320/111 |
| 5,436,802 | A | * 7/1995 | Trahan et al. | 361/816 |
| 6,049,468 | A | 4/2000 | Learmonth | |
| 6,316,721 | B1 | 11/2001 | Koitsalu et al. | |
| 7,075,798 | B2 | * 7/2006 | Hendrickson | 361/818 |
| 7,660,132 | B2 | * 2/2010 | Tanaka | 361/816 |

(Continued)

FOREIGN PATENT DOCUMENTS

JP 2003036614 7/2003

OTHER PUBLICATIONS

Mechanical Design Tips for EMI Shielding, Holland Shielding, (7 pages). [Retrieved on Sep. 12, 2012]. Retrieved from the Internet<URL:"http://www.hollandshielding.com/?p=Nieuws&id=106&Lang=2">.

*Primary Examiner* — Forrest M Phillips
(74) *Attorney, Agent, or Firm* — Treyz Law Group; Kendall P. Woodruff; Joseph F. Guihan

(57) ABSTRACT

An electronic device may include subassemblies such as battery structures, electromagnetic shielding structures, and button structures. The electromagnetic shielding structures may include a conductive fence and a flexible shielding layer that covers electronic components. The electromagnetic shielding structure may be formed with a recess that receives a protruding portion of a battery. The recess may be formed from a multi-level shielding structure that includes rigid and flexible portions. The button structures may be mounted to a ledge that is formed as an integral part of a device housing. An electronic device battery may be enclosed in a protective battery sleeve. The battery sleeve may include a center portion that encloses the battery and peripheral portions that are folded and coupled to the center portion by adhesive material interposed between opposing surfaces of the folded peripheral portions and the center portion of the battery sleeve.

30 Claims, 14 Drawing Sheets

(56) References Cited

U.S. PATENT DOCUMENTS

| | | | |
|---|---|---|---|
| 7,903,431 B2 * | 3/2011 | English et al. | 361/816 |
| 7,983,058 B2 * | 7/2011 | Ishihara | 361/816 |
| 7,986,533 B2 * | 7/2011 | Ren et al. | 361/818 |
| 2005/0141209 A1 * | 6/2005 | Chen | 361/800 |
| 2005/0257370 A1 * | 11/2005 | Cunningham et al. | 29/840 |
| 2007/0119620 A1 | 5/2007 | Rodriguez et al. | |
| 2007/0268679 A1 * | 11/2007 | Kao | 361/800 |
| 2011/0255250 A1 | 10/2011 | Dinh et al. | |

* cited by examiner

ELECTRONIC DEVICE SUBASSEMBLIES

BACKGROUND

This relates generally to electronic devices, and more particularly, to electronic device subassemblies.

Electronic devices such as computers, media players, cellular telephones, and other portable electronic devices often include mechanical and electronic components such as buttons, batteries, and wireless circuitry. For example, cellular telephone transceiver circuitry and wireless local area network circuitry may allow a device to wirelessly communicate with external equipment. Antenna structures may be used in transmitting and receiving associated wireless signals. A battery may be used to provide power for an electronic device.

It can be challenging to incorporate components such as wireless circuitry and batteries on an electronic device. Space is often at a premium, particularly in compact devices such as portable electronic devices. The components such as the battery and device circuitry may be constrained. In addition, the presence of metal in device components and on printed circuit boards may affect antenna performance. If care is not taken, antenna structures may not perform satisfactorily or components may consume more space within an electronic device than desired. It may also be difficult to provide adequate structural support for mechanical components such as buttons in compact designs.

It would therefore be desirable to be able to provide improved electronic device subassemblies in an electronic device.

SUMMARY

An electronic device may include subassemblies such as battery structures, electromagnetic shielding structures, and button structures.

The electromagnetic shielding structures may be used to electromagnetically shield circuitry on a printed circuit substrate. The circuitry may include one or more electronic components mounted to the substrate. The electronic components may have different heights. The electromagnetic shielding structures may include a conductive fence that surrounds some of the electronic components. A flexible electromagnetic shielding layer may be used to cover the electronic components and the conductive fence. The flexible electromagnetic shielding layer may be a metal foil, conductive fabric, or formed from other flexible shielding materials. One or more of the components that are covered by the shielding layer may be taller than the surrounding fence and may be accommodated by flexing of the shielding layer.

The flexible electromagnetic shielding layer may be attached to the conductive fence via adhesives, solder, welds, or other connections. For example, the electromagnetic shielding layer may be welded to the fence using a sacrificial layer of metal that helps to protect the shielding layer from damage during welding operations.

The electromagnetic shielding structure may be formed as a multi-level shielding structure with a recess that receives a portion of a battery (e.g., a protruding portion of the battery). The multi-level shielding structure may include rigid and flexible portions. The multi-level shielding structure may include a shielding layer attached to a conductive fence to cover electronic components. The flexible portion of the multi-level shielding structure may form part of the recess. The rigid portions may include openings that are covered by the flexible portion of the shielding structure. Electronic components that are taller than surrounding rigid portions of the shielding structure may be positioned within the openings and accommodated by the flexible portions of the shielding structure that covers the openings.

The electronic device may include button structures. The button structures may include a switch and a button member that may be pressed to actuate the switch. The switch may be mounted to a ledge of the housing via a bracket. The ledge may be formed as an integral part of the housing. For example, the ledge may be a machined ledge formed as an integral portion of the housing. The housing may include an opening through which the button member protrudes from the electronic device. The opening may face the housing ledge. The housing ledge may include a trench that mates with a corresponding protruding portion of the bracket to help ensure that the position of the switch and bracket is maintained relative to the position of the opening in the housing.

The battery of the electronic device may be enclosed in a protective battery sleeve. The battery sleeve may include a center portion that encloses the battery and peripheral portions that are folded and coupled to the center portion by adhesive material interposed between opposing surfaces of the folded peripheral portions and the center portion of the battery sleeve. The folded peripheral portions may surround the center portion of the battery sleeve.

Further features of the invention, its nature and various advantages will be more apparent from the accompanying drawings and the following detailed description of the preferred embodiments.

DETAILED DESCRIPTION

An electronic device such as a portable (e.g., mobile) electronic device or other compact electronic device may include subassemblies having mechanical and electronic components.

Figure 1:
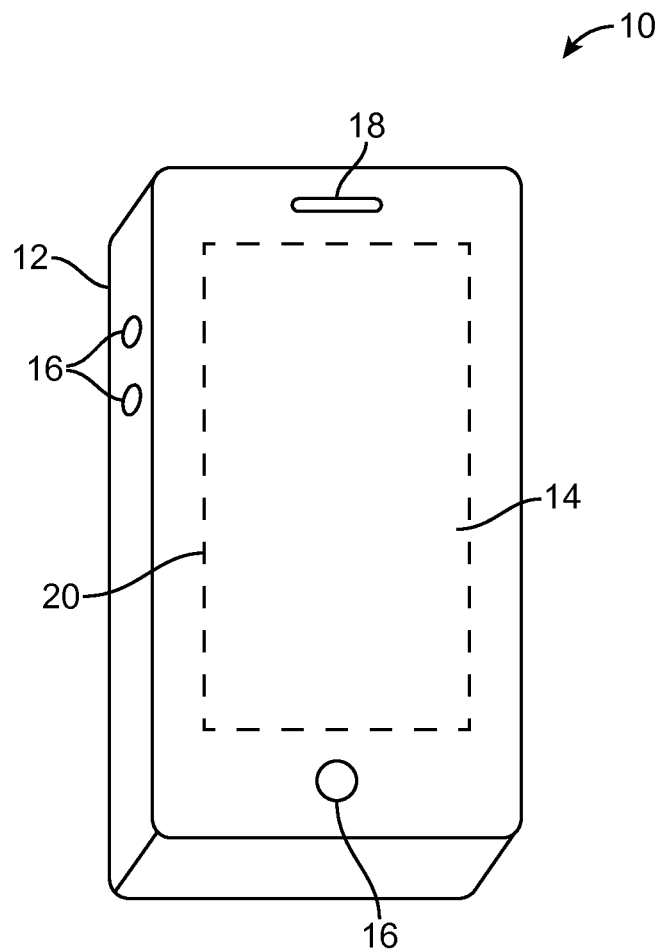
FIG. 1 is a perspective view of an illustrative electronic device in accordance with an embodiment of the present invention.

An illustrative electronic device is shown in FIG. 1. Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, a media player, etc.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may, if desired, have a display such as display 14. Display 14 may, for example, be a touch screen that incorporates capacitive touch electrodes. Display 14 may include image pixels formed from light-emitting diodes (LEDs), organic LEDs (OLEDs), plasma cells, electronic ink elements, liquid crystal display (LCD) components, or other suitable image pixel structures. A cover glass layer may cover the surface of display 14.

The cover glass layer that covers display 14 may have openings such as a circular opening for button 16 and a speaker port opening such as speaker port opening 18 (e.g., for an ear speaker for a user). Device 10 may also have other openings (e.g., openings in display 14 and/or housing 12 for accommodating volume buttons, ringer buttons, sleep buttons, and other buttons, openings for an audio jack, data port connectors, removable media slots, etc.). For example, openings in housing 12 may accommodate buttons 16 such as volume buttons.

Housing 12 may include a peripheral conductive member such as a bezel or band of metal that runs around the rectangular outline of display 14 and device 10 (as an example). The peripheral conductive member may be used in forming the antennas of device 10 if desired. Antennas may be located along the edges of device 10, on the rear or front of device 10, as extending elements or attachable structures, or elsewhere in device 10.

Figure 2:
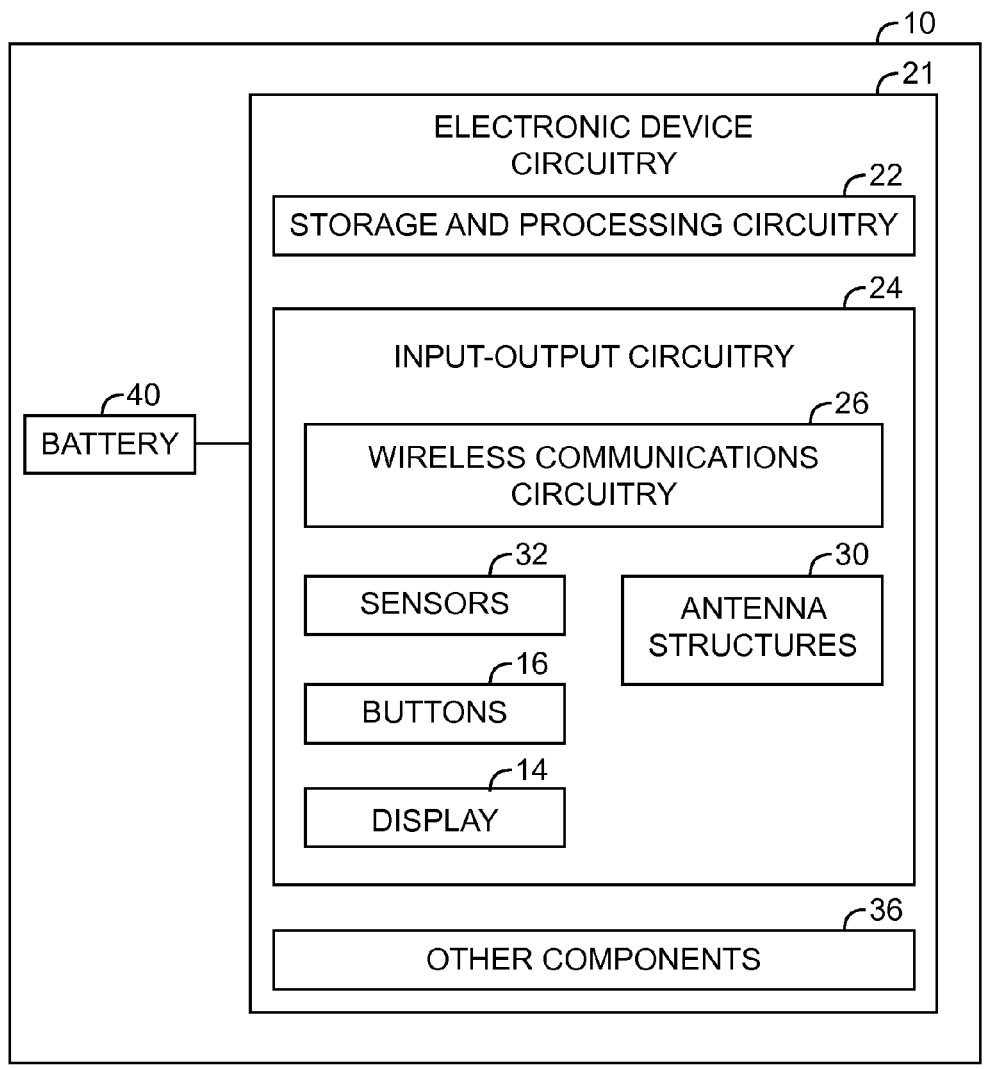
FIG. 2 is a schematic diagram of an illustrative electronic device having circuitry and a battery in accordance with an embodiment of the present invention.

An illustrative schematic diagram of an electronic device 10 is shown in FIG. 2. As shown in FIG. 2, electronic device 10 may include electronic device circuitry 21 and battery 40. Electronic device circuitry 21 may include storage and processing circuitry 22, input-output circuitry 24, and other components such as components 36.

Storage and processing circuitry 22 may be configured to execute software that controls the operation of device 10. Processing circuitry 22 may include microprocessor circuitry, digital signal processor circuitry, microcontroller circuitry, application-specific integrated circuits, and other processing circuitry. Storage circuitry 22 may include storage such as volatile and non-volatile memory, hard-disk storage, removable storage, solid state drives, random-access memory, memory that is formed as part of other integrated circuits such as memory in a processing circuit, etc.

Input-output circuitry 24 may include components for receiving input from external equipment and for supplying output from device 10. For example, input-output circuitry 24 may include wireless communications circuitry 26. Wireless communications circuitry 26 may be used for transmitting and/or receiving signals in one or more communications bands such as cellular telephone bands, wireless local area network bands (e.g., the 2.4 GHz and 5 GHz IEEE 802.11 bands), satellite navigation system bands, etc.).

As an example, wireless communications circuitry 26 may include radio-frequency transceivers, impedance matching circuitry, filter circuitry, switches, and other circuits implemented using one or more components such as integrated circuits, discrete components (e.g., capacitors, inductors, and resistors), surface mount technology (SMT) components, or other electrical components. Antenna structures 30 may include inverted-F antennas, patch antennas, loop antennas, monopoles, dipoles, or other suitable antennas.

Sensors 32 may include an ambient light sensor, a proximity sensor, touch sensors such as a touch sensor array for a display and/or touch buttons, pressure sensors, temperature sensors, accelerometers, gyroscopes, and other sensors.

Buttons 16 may include sliding switches, push buttons, menu buttons, buttons based on dome switches, keys on a keypad or keyboard, or other switch-based structures.

Display 14 may be a liquid crystal display, an organic light-emitting diode display, an electrophoretic display, an electrowetting display, a plasma display, or a display based on other display technologies.

Device 10 may also contain other components 36 (e.g., communications circuitry for wired communications, status indicator lights, vibrators, etc.). Components 36 may include circuitry such as clock generation circuitry or power supply circuitry.

Battery 40 may provide power for electronic device circuitry 21. For example, battery 40 may include battery cells sealed within a battery sleeve. The battery sleeve may be formed from sheets of foil, plastic, or other desired materials.

The battery cells may, as an example, include lithium-ion cells or other desired types of battery cells.

Some of electronic device circuitry 21 may be sensitive to electromagnetic interference. For example, wireless communications circuitry 26 may include wireless transceivers that are sensitive to radio-frequency interference from other circuitry such as clock generation or power supply circuitry. Some of electronic device circuitry 21 may produce radio-frequency interference (e.g., a cellular transceiver may emit radio-frequency signals that interfere with operation of other components of device 10 that are sensitive to radio-frequency interference). To help ensure that the circuitry of device 10 operates properly, it may be desirable to provide electromagnetic shielding structures for some or all of the components of device 10.

Figure 3:
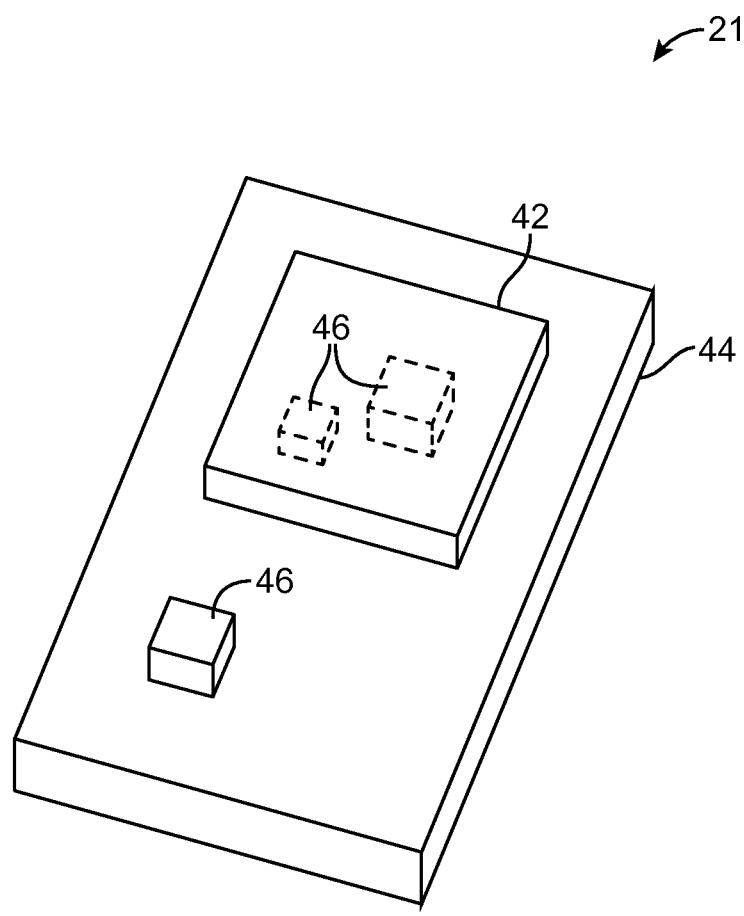
FIG. 3 is a perspective view of electronic device circuitry including electronic components that are enclosed by electromagnetic shielding structures in accordance with an embodiment of the present invention.

FIG. 3 is an illustrative diagram of electronic device circuitry 21 that may include shielding structures 42. As shown in FIG. 3, electronic device circuitry 21 may include one or more electronic components 46 formed on a printed circuit substrate 44 (e.g., a printed circuit board). Electronic components 46 may include circuitry such as communications circuitry 26, sensors 32, or other electronic device circuitry. As an example, components 46 may be surface-mount technology (SMT) components that are mounted directly onto printed circuit substrate 44. Components 46 may include integrated circuit components and discrete components such as discrete capacitors, inductors, resistors, etc.

Printed circuit substrate 44 may be formed from rigid printed circuit board materials such as fiberglass-filled epoxy (e.g., FR4), flexible printed circuits (e.g., printed circuits formed from flexible sheets of polymer such as polyimide), and rigid flex circuits (e.g., printed circuits that contain both rigid portions and flexible tails).

Shielding structures 42 may be formed using electromagnetic shielding materials and/or insulating materials. For example, shielding materials used to form shielding structures 42 may include conductive materials such as metals (e.g., copper, aluminum, etc.), metal alloys, conductive adhesives, conductive paint (e.g., silver paint, platinum paint, etc.), metal foil, solder, or other desired electromagnetic shielding materials. Shielding materials 18 may be formed in various configurations including walls, fences, sheets, layers, combinations of these configurations, or other desired arrangements. For example, shielding materials 18 may be used to form a fence that surrounds components 46 and a lid that covers the fence. Shielding structures 42 may cover or enclose one or more components 46 (e.g., components that generate electromagnetic interference or are sensitive to electromagnetic interference). If desired, electronic device circuitry 21 may be provided with multiple shielding structures 42 that shield respective portions of circuitry 21.

Insulating materials used to form shielding structures 42 may help prevent electrical shorting between shielding materials of structure 42 and conductive materials such as conductive portions of components 46. The insulating materials may be formed from dielectric materials such as plastics or other desirable materials that provide electrical insulation.

Components 46 of electronic device circuitry 21 may have different physical dimensions. For example, some components may be taller than other components or may occupy a larger footprint on printed circuit substrate 44. It may be challenging to provide shielding structures 42 for shielding multiple components having different physical dimensions. For example, shielding structures 42 that are insufficiently tall may be damaged by contact with components. As another example, shielding structures 42 that are sufficiently tall to cover each of the components may leave gaps between the shielding structures 42 and relatively short components, which may result in inefficient use of available space in a compact electronic device.

Figure 4:
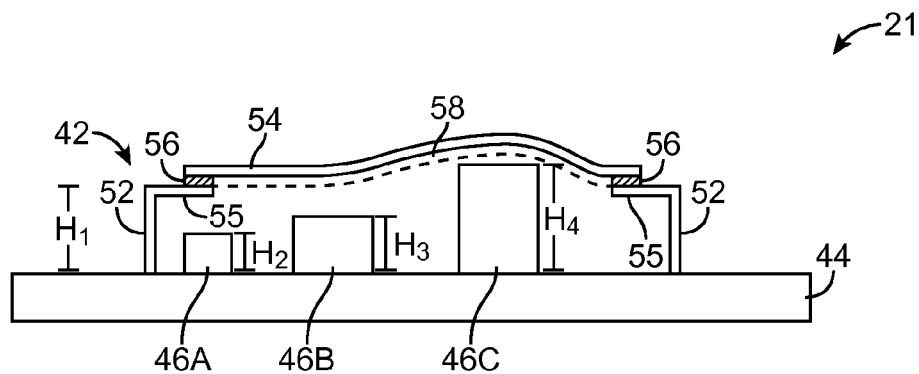
FIG. 4 is a cross-sectional side view of electromagnetic shielding structures including a fence and a flexible shielding layer attached to the fence in accordance with an embodiment of the present invention.

FIG. 4 is an illustrative cross-sectional side view of shielding structures 42 for electronic device circuitry 21. As shown in FIG. 4, shielding structures 42 may include fences 52 and shielding layer 54 that covers underlying components 46A, 46B, and 46C. Fences 52 may surround components 46A, 46B, and 46C. Fences 52 may have height H1 and may be formed from any desired shielding material. Fences 52 may provide structural support for shielding layer 54. For example, fences 52 may be formed from metal or other conductive materials. Shielding layer 54 may be attached to fences 52 via connections 56. Fences 52 may include protruding ledges 55 to which shielding layer 54 may be attached via connections 56. Connections 56 may include solder joints, laser welds, conductive adhesives, or any desired connections. Connections 56 may be formed between protruding ledges 55 of fences 52 and shielding layer 54.

Shielding layer 54 may be formed from a flexible shielding material. For example, shielding layer 54 may be formed from a metal foil (e.g., aluminum foil, copper foil, etc.), a metal coating on a sheet of dielectric, or may be formed from a conductive fabric such as a woven conductive fabric. Conductive fabrics used to form shielding layer 54 may include fabrics formed from metal fibers or fibers that are coated with a conductive material (e.g., metal). For example, fibers such as plastic fibers, glass fibers, carbon fibers, organic fibers, inorganic fibers, fibers formed from other materials, and fibers formed from two or more of these materials may be coated with a conductive material to form a conductive fabric. If desired, shielding layer 54 may be formed from other materials such as stainless steel or metal alloys.

Shielding layer 54 may accommodate components 46 of various heights while providing electromagnetic shielding for the components. In the example of FIG. 4, components 46A, 46B, and 46C may be shielded by shielding structures 42. Components 46A, 46B, and 46C may have respective heights H2, H3, and H4. Heights H2 and H3 of components 46A and 46B may be less than height H1 of fence 52, whereas height H4 of component 46C may be greater than height H1. Flexible shielding layer 54 may flex to accommodate height H4 of component 46C while maintaining an overall slim profile.

If desired, an optional layer of insulating material 58 may be interposed between shielding layer 54 and components such as component 46C. Insulating layer 58 may be formed from insulating materials such as dielectric materials. For example, insulating layer 58 may be formed from an adhesive polymer layer such as polyimide that is attached to the underside of shielding layer 54. Insulating layer 58 may serve to help prevent electrical shorting between conductive materials of shielding layer 54 and components such as component 46C.

Figure 5:
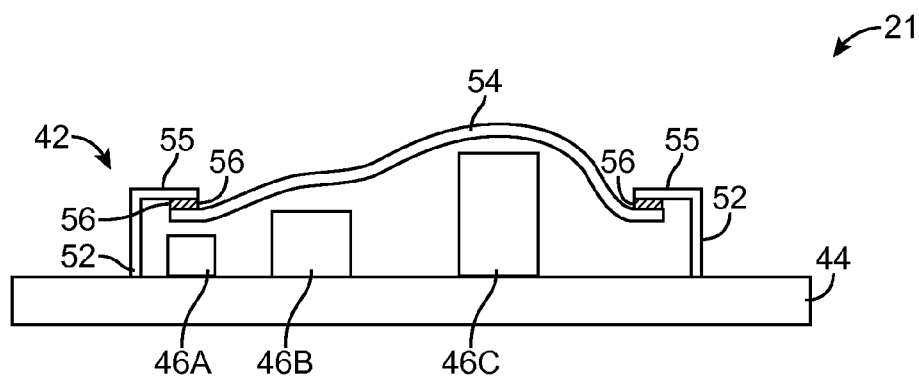
FIG. 5 is a cross-sectional side view of electromagnetic shielding structures including a fence and a flexible shielding layer attached to the underside of protruding ledges of the fence in accordance with an embodiment of the present invention.

The example of FIG. 4 in which shielding layer 54 is attached to a top surface of protruding ledges 55 is merely illustrative. If desired, shielding layer 54 may be attached to the underside (e.g., a bottom surface) of protruding ledges 55 of fences 52 as shown in FIG. 5. By attaching shielding layer 54 to the underside of protruding ledges 55, the overall volume of shielding structures 42 may be further reduced.

Figure 6:
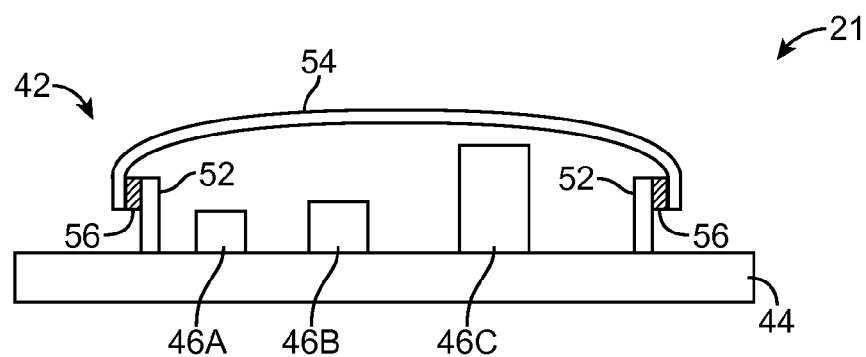
FIG. 6 is a cross-sectional side view of electromagnetic shielding structures including a fence and a flexible shielding layer attached to exterior surfaces of the fence in accordance with an embodiment of the present invention.

The examples of FIG. 4 and FIG. 5 in which shielding layer 54 is attached to either a top surface or a bottom surface of protruding ledges 55 is merely illustrative. If desired, fences 52 may be formed without any protruding ledges as shown in FIG. 6. Fences 52 may be formed vertically and may have opposing inner and outer surfaces (e.g., inner surfaces that face the interior of shielding structures 42 and outer surfaces that face the exterior of shielding structures 42). In the example of FIG. 6, shielding layer 54 is attached to the outer surfaces of fences 52. However, shielding layer 54 may be attached to the inner surfaces of fences 52, or may be attached to a combination of inner and outer surfaces of fences 52 (as examples).

Figure 7:
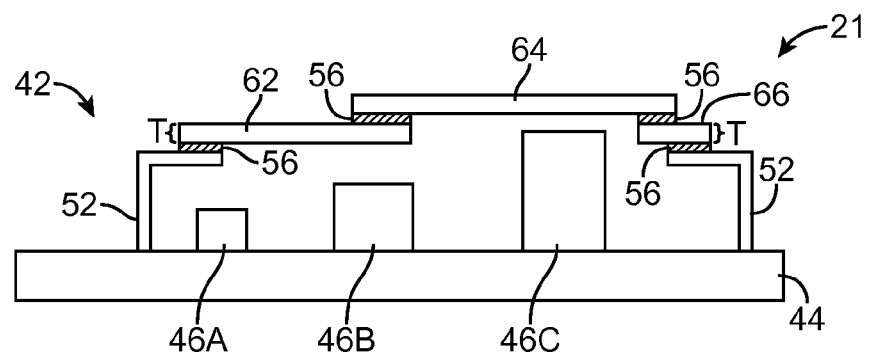
FIG. 7 is a cross-sectional side view of electromagnetic shielding structures including a fence and multiple shielding layers attached to the fence in accordance with an embodiment of the present invention.

Shielding structures 42 may include covers formed from multiple shielding layers. FIG. 7 is an illustrative cross-sectional diagram showing shielding structures 42 having shielding layers 62, 64, and 66 that cover components 46A, 46B, and 46C. Shielding layers 62 and 66 may be attached to fences 52 via connections 56. Shielding layers 62 and 66 may extend horizontally to cover components such as components 46A and 46B that have sufficiently low heights (e.g., the height of fences 52 may be greater than or equal to the heights of components 46A and 46B).

Components such as component 46C may have heights that exceed the height of fences 52 and may be covered by additional shielding layer 64 that is attached to shielding layers 62 and 66 via connections 56. The thickness T of layers 62 and 66 may be added to the height of fences 52 to provide sufficient clearance between additional shielding layer 64 and component 46C. In other words, the height of additional shielding layer 64 (e.g., the distance between shielding layer 64 and substrate 44) may be greater than the height of component 46C.

In scenarios such as when shielding structures 42 are formed from a shielding layer 54 that is welded to fences 52 (e.g., via laser welding), it may be desirable to provide structures 42 with sacrificial regions. For example, to help reduce the total height of shielding structures 42, shielding layers 54 may be formed from a thin layer of metal foil (e.g., a metal foil layer that is less than 150 μM). In this scenario, sacrificial metal layers may be used to help prevent damage to shielding layers 54 during laser welding operations.

Figure 8:
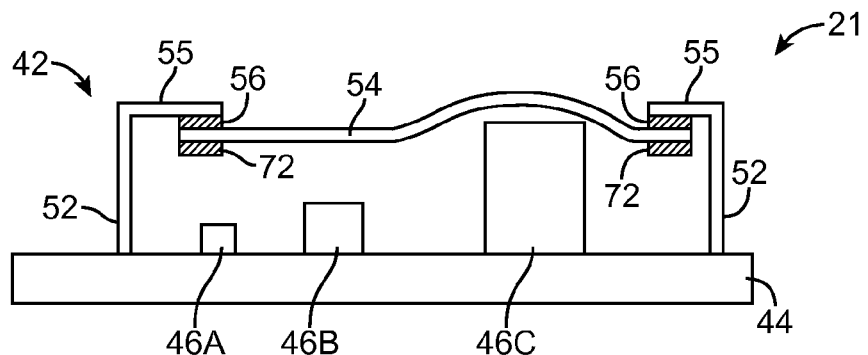
FIG. 8 is a cross-sectional side view of electromagnetic shielding structures including a fence and a shielding layer attached to the fence by a welded connection through a sacrificial layer in accordance with an embodiment of the present invention.

FIG. 8 is an illustrative cross-sectional diagram showing how shielding structures 42 may be provided with sacrificial layers 72 that cover regions of shielding layer 54 over protruding portions 55 of fences 52. Sacrificial layers 72 may be formed from metal or other sacrificial materials. For example, metal may be plated onto portions of shielding layer 54 to form sacrificial layers 72. Connections 56 may be formed using sacrificial layers 72 and shielding layer 54. During welding operations such as laser welding, sacrificial layers 72 may help prevent shielding layer 54 from being damaged while connections 56 are made.

The example of FIG. 8 in which shielding layer 54 is formed on bottom surfaces of protruding ledges 55 is merely illustrative. If desired, shielding layer 54 may be formed on top surfaces of fences 52 using sacrificial layers (regions) 72 that cover portions of shielding layer 54.

Figure 9:
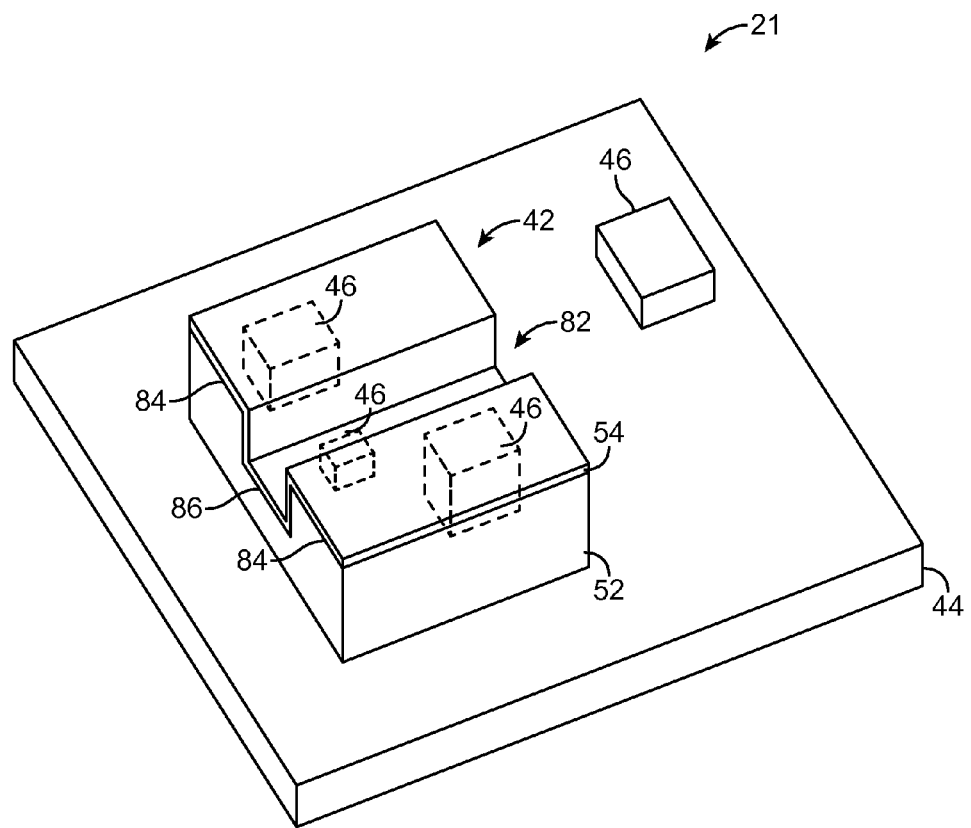
FIG. 9 is a perspective view of electromagnetic shielding structures including a fence having segments with different heights in accordance with an embodiment of the present invention.

Shielding structures 42 may be formed with fences 52 that conform to the dimensions and locations of components 46 that are surrounded by fences 52. FIG. 9 is an illustrative perspective view of electronic device circuitry 21 having shielding structures 42 with fences 52 that conform to components 46. As shown in FIG. 9, fence 52 may include trench 82 that accommodates relatively short components 46 while helping to minimize total volume of shielding structures 42. In other words, fence 52 may include portions 84 at a first height that accommodates relatively tall components 46 and portion 86 that accommodates relatively short components 46. A shielding layer 54 that conforms to the structure of fences 52 may be formed over components 46.

Figure 10:
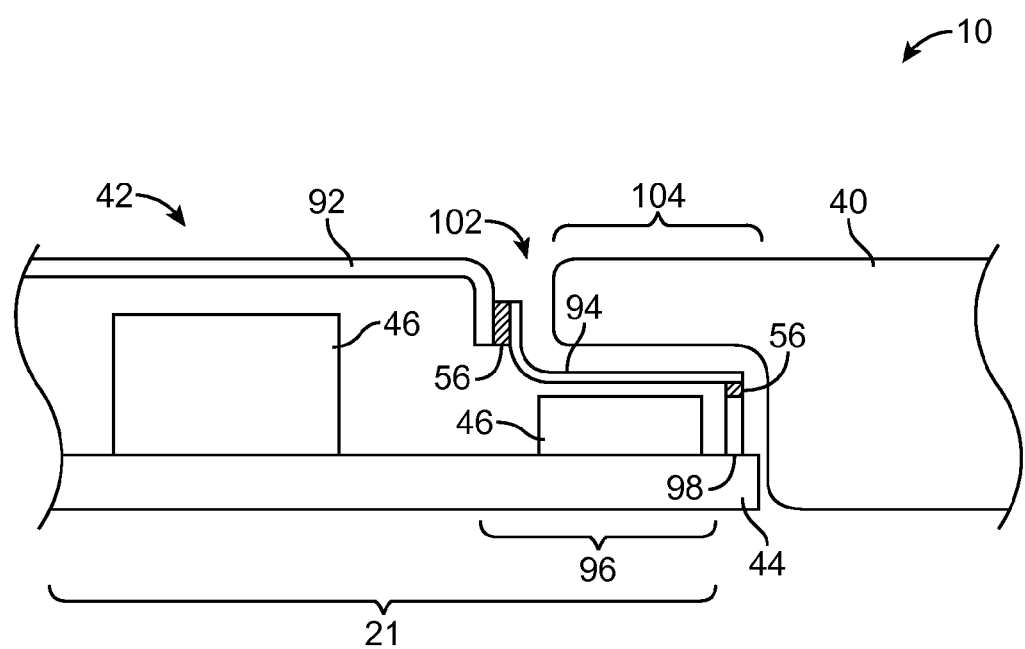
FIG. 10 is a cross-sectional side view of electromagnetic shielding structures having a recess that accommodates a battery in accordance with an embodiment of the present invention.

Shielding structures that conform to dimensions of underlying components may be used to help provide more efficient utilization of available space in electronic devices. FIG. 10 is an illustrative cross-sectional diagram showing how shielding structures 42 of electronic device circuitry 21 may be provided with a recess that accommodates protruding portions of battery 40.

As shown in FIG. 10, shielding structures 42 may conform to the dimensions of underlying components 46. Components 46 may be placed (e.g., mounted) on printed circuit substrate 44 in an arrangement such that shorter components are located at the periphery of printed circuit substrate 44, whereas taller components are centrally located. Shielding structures 42 may include shielding layers 92 and 94. Shielding layer 92 may cover relatively tall components (e.g., centrally located components), whereas shielding layer 94 may cover relatively short components (e.g., peripherally located components). Shielding layer 92 may be formed from a rigid shielding material such as a rigid metal layer. For example, shielding layer 92 may be formed from a metal lid attached to fences such as fences 52 of FIG. 9.

In region 96 of shielding structures 42, an opening may be formed in shielding layer 92. A flexible shielding layer 94 may be attached to rigid shielding layer 92 to cover the opening in region 96. Flexible shielding layer 94 may, for example, be formed from flexible conductive materials such as metal foil, dielectric material coated with metal, conductive fabric, etc. Flexible shielding layer 94 may be attached to rigid shielding layer 92 via connection 56 and may extend across the opening in region 96 of shielding structures 42 to fence 98. Fence 98 may be somewhat shorter than fences such as fence 52. For example, fence 52 may conform to the height of components 46 that are covered by flexible shielding layer 94.

Shielding layers 92 and 94 may combine to form multi-level shielding structures 42 that accommodates various component dimensions (e.g., shielding layer 92 may form an upper level of shielding structures 42 whereas shielding layer 94 may form a lower level of shielding structures 42). Recess 102 may be formed by forming shielding layer 94 at a lower height than shielding layer 92. Recess 102 may be used to accommodate protruding region 104 of battery 40. Protruding region 104 may provide battery 40 with additional capacity and help to improve battery life of device 10 without increasing the overall size of device 10 (e.g., by efficiently using available space within device 10).

Figure 11:
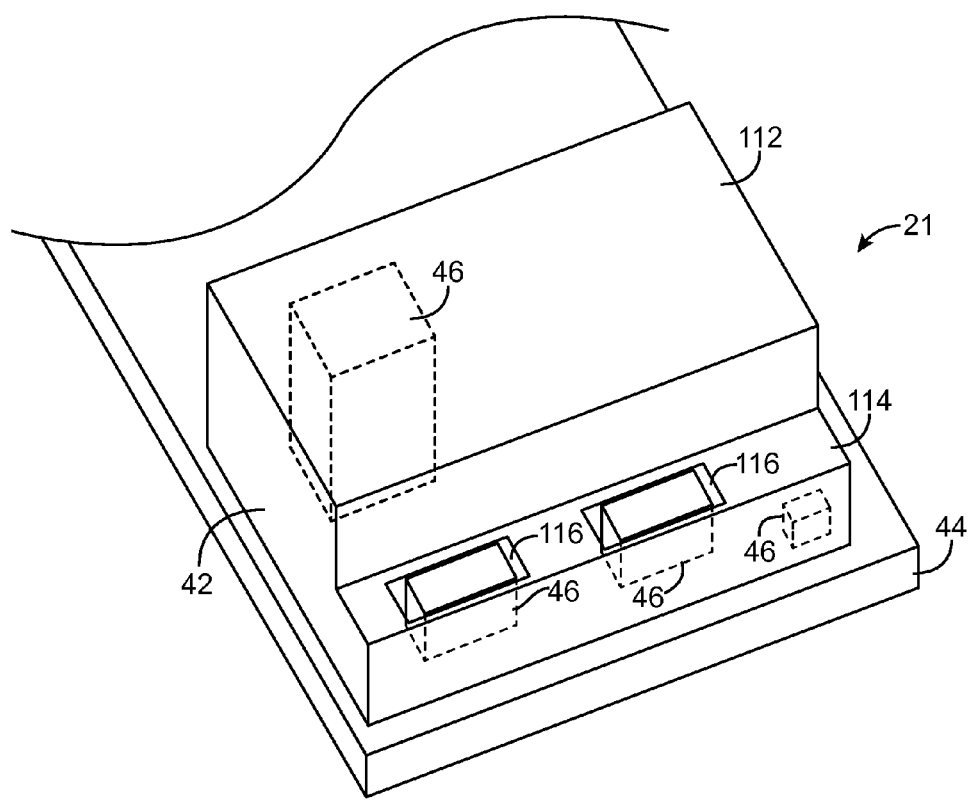
FIG. 11 is a perspective view of electromagnetic shielding structures including a fence and a shielding layer having openings that may be covered by additional shielding layers in accordance with an embodiment of the present invention.

Shielding layer 92 may be formed over openings in a lower level of shielding structures 42. FIG. 11 is an illustrative perspective view of electronic device circuitry 21 with shielding structures 42 having an upper level 112 and a lower level 114. Upper level 112 may cover relatively tall components 46 (e.g., components that are taller than lower level 114), whereas lower level 114 may be used to shield other components 46 (e.g., relatively short components formed at the periphery of substrate 44).

Openings 116 may be formed in lower level 114 to accommodate one or more components 46 that are taller than lower level 114 but not sufficiently tall as to require placement within upper level 112. In some scenarios, manufacturing tolerances may require that sufficient clearance be provided between components 46 and the interior surfaces of rigid portions of shielding structures 42. For example, a minimum distance may be required between the top surfaces of components 46 and the interior surface of rigid portions of lower level 114 to help ensure that variance in the height of components 46 or lower level 114 does not result in undesired contact between components 46 and the rigid portions lower level 114 (e.g., contact that could potentially damage lower level 114 or components 46).

The example of FIG. 11 in which openings 116 are formed in lower level 114 is merely illustrative. If desired, openings such as openings 116 may be similarly formed in upper level 112 (e.g., to accommodate components 46 having heights that exceed the height of upper level 112).

Figure 12:
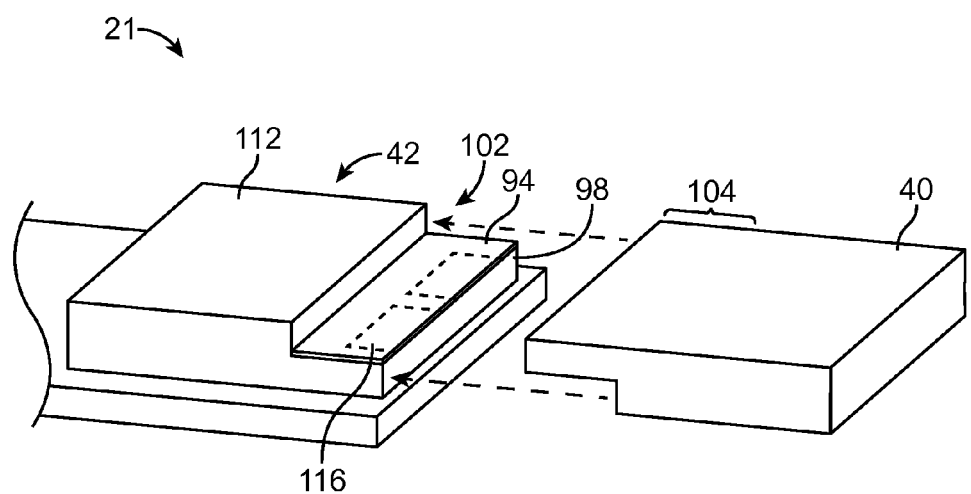
FIG. 12 is a perspective view of electromagnetic shielding structures having a recess that accommodates a protruding portion of a battery in accordance with an embodiment of the present invention.

Openings 116 may be covered by shielding layers such as flexible shielding layers. FIG. 12 is an illustrative perspective view showing how openings 116 may be covered by shielding layer 94. Shielding layer 94 may be formed from a flexible material such as metal foil or conductive fabric. Shielding layer 94 may be attached to portions of shielding structure 112 via connections such as connections 56 (FIG. 10). As shown in FIG. 12, protruding portion 104 of battery 40 may be accommodated by recess 102 of shielding structures 42 (e.g., a recess formed by dividing shielding structures 42 into multiple levels).

Electronic devices may include buttons that can be actuated (e.g., by a user). The buttons may include button members that are pressed to actuate corresponding switches. It may be challenging to manufacture buttons in electronic devices. For example, due to manufacturing tolerances, it may be difficult to precisely mount switches relative to corresponding button members. Button members may also be subject to excessive force that is applied to the button members (e.g., by users).

Figure 13:
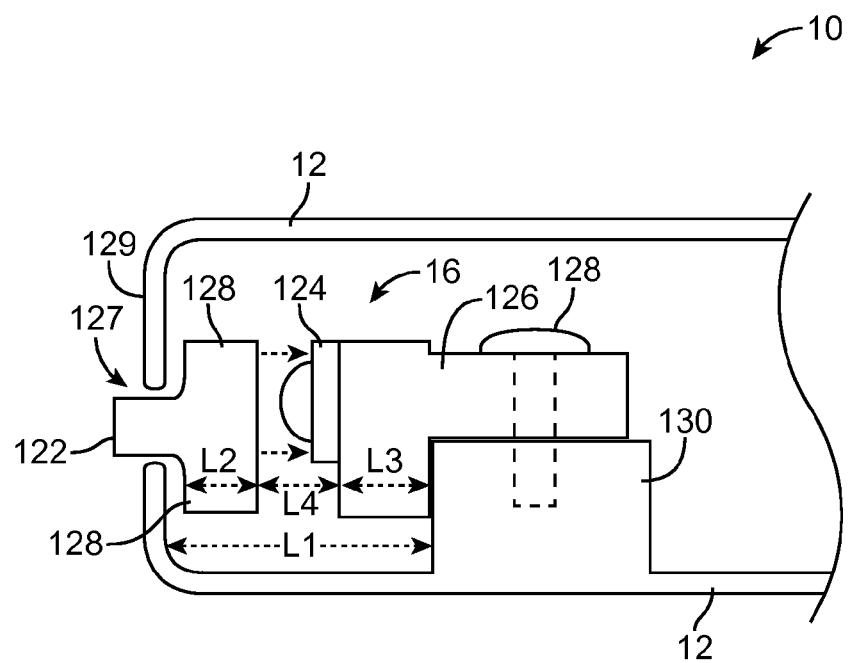
FIG. 13 is a cross-sectional side view of button structures that are structurally supported by a housing ledge in accordance with an embodiment of the present invention.

Buttons in an electronic device may be structurally supported using portions of an electronic device housing. FIG. 13 is an illustrative cross-sectional diagram of electronic device 10 having button 16 that is structurally supported by a portion of electronic device housing 12.

As shown in FIG. 13, button 16 may include switch 124 and a button member 122 that can be pressed to actuate switch 124. For example, button member 122 may be pressed by a user so that button member 122 contacts and actuates switch 124. Button member 122 may be formed from any desired material such as plastic, metal, or other materials. For example, button member 122 may be machined or die-cast from metals or metal alloys such as aluminum, copper, etc. Switch 124 may be formed from any desired type of switch. For example, switch 124 may be a dome switch. In this scenario, the dome switch may be compressed when button member 128 is pressed, which shorts metal contacts in the dome switch and actuates the dome switch.

Housing 12 may include opening 127 that accommodates button member 122. Button member 122 may include flange portions 128 that help prevent button member 122 from passing through opening 127. Flange portions 128 may help to maintain the position of button member 122 within housing 122.

Switch 124 may be mounted to bracket 126. Bracket 126 may be formed from metal. For example, metal bracket 126 may be machined or die-cast from metals or metal alloys. Metal bracket 126 may be mounted to ledge 130 of housing 12. In the example of FIG. 13, bracket 126 is mounted to ledge 130 using one or more screws 128.

Housing ledge 130 may be formed as an integral portion of housing 12. For example, ledge 130 may be formed from a block of metal such as aluminum that is also used to form housing 12. Machining tools (e.g., cutting tools, milling tools, grinding tools, computer-controlled machining tools etc.) may be used to form ledge 130 as an integral portion of housing 12. Integral housing ledge 130 formed using machining tools may sometimes be referred to herein as a machined ledge.

Ledge 130 may help reduce variability in the structure of button 16 (e.g., variance associated with manufacturing tolerances of tools used to form button 16). In the example of FIG. 13, ledge 130 is formed at a distance L1 from side wall 129 of housing 12 in which opening 127 is formed. Because ledge 130 is formed as an integral part of housing 12, distance L1 may be relatively insensitive to manufacturing tolerances. Button member 122 may abut side wall 129 and include flange portion 128 having width L2 (i.e., button member 122 may extend from side wall 129 at a distance L2). Bracket 126 may extend from ledge 130 at a distance L3. Distances L2 and L3 may have minimal variance, because button member 128 and bracket 126 may be formed using manufacturing techniques such as molding or die-casting having minimal variance. The remaining gap between button member 128 and bracket 128 may have a distance L4 that is determined by the difference between L1 and the sum of L2 and L3. Distance L4 may also have minimal variance, because distances L1, L2, and L3 have minimal variance and the locations of button member 122 and bracket 126 are substantially fixed by housing side wall 129 and housing ledge 130.

Housing ledge 130 may serve as a stable structural support for bracket 126 and switch 124. When button member 122 is pressed, force may be transferred from button member 122 to ledge 130 via switch 124 and bracket 126. Button member 122 and bracket 126 may be maintained in a stable position even in scenarios in which excess force is applied to button member 122 (e.g., by a user), because the excess force may be transferred to housing 12 via integral housing ledge 130.

Figure 14:
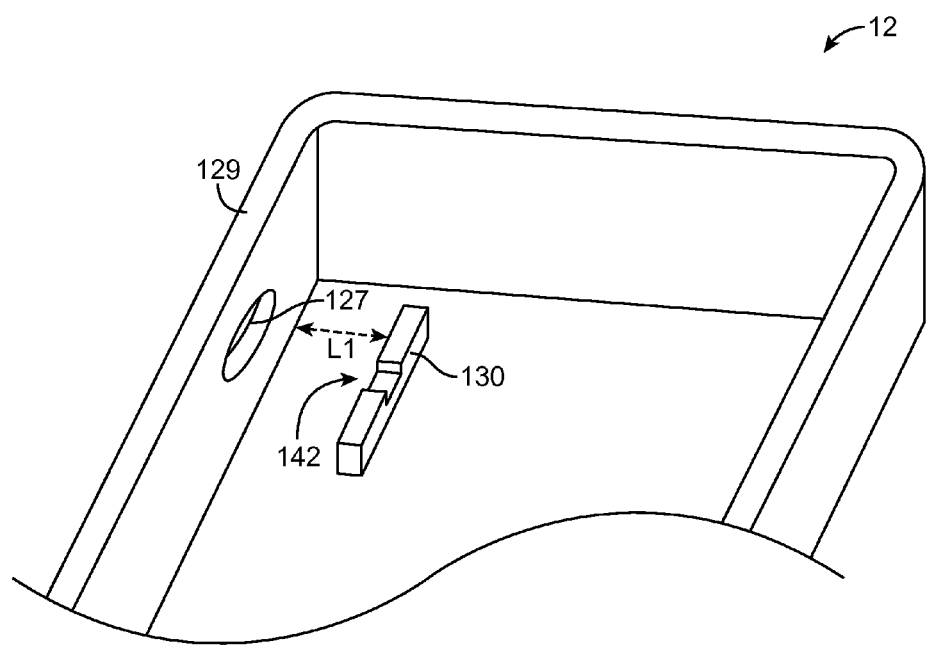
FIG. 14 is a perspective view of a device housing having a button opening and an opposing integral housing ledge in accordance with an embodiment of the present invention.

If desired, housing ledge 130 may be formed with a recess that mates with a protruding portion of bracket 126. FIG. 14 is an illustrative perspective view of a housing 12 with an integral housing ledge 130 having recess 142. Ledge 130 may oppose button opening 127 in side wall 129 of housing 12. Recess 142 may be formed from housing ledge 130 using tools such as machining tools (e.g., computer-controlled machining tools). For example, recess 142 may be formed simultaneously with ledge 130 from housing 12 or may be formed subsequent to machining ledge 130.

Figure 15:
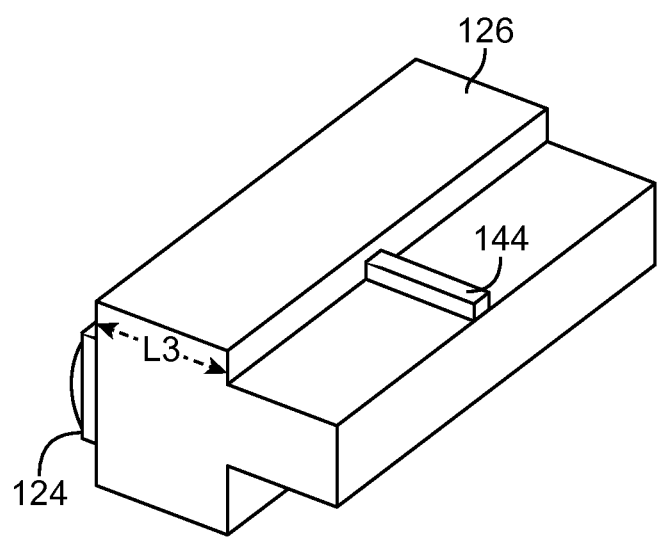
FIG. 15 is a perspective view of a switch bracket having a protruding member that may mate with an integral housing ledge in accordance with an embodiment of the present invention.

FIG. 15 is an illustrative underside perspective view of a bracket 126 having a protruding portion 144 for mating with recess 142 of housing ledge 130 (FIG. 14). Protruding portion 144 is shown in the example of FIG. 15 as substantially rectangular, but may be formed having any desired shape. Protruding portion 144 of bracket 126 may mate with recess 142 of ledge 130 to help prevent undesired movement of bracket 126 and switch 124 relative to opening 127 of side wall 129. If desired, protruding portion 144 may be used in combination with one or more screws 128 as shown in FIG. 13.

The example of FIGS. 13, 14, and 15 in which switch 124 is mounted to bracket 126 is merely illustrative. If desired, multiple switches 124 may be mounted to bracket 126. For example, multiple openings in side wall 127 of FIG. 14 may be formed to accommodate multiple button members 122. In this scenario, each button member may mate with a corresponding switch that is mounted to bracket 126.

Figure 16:
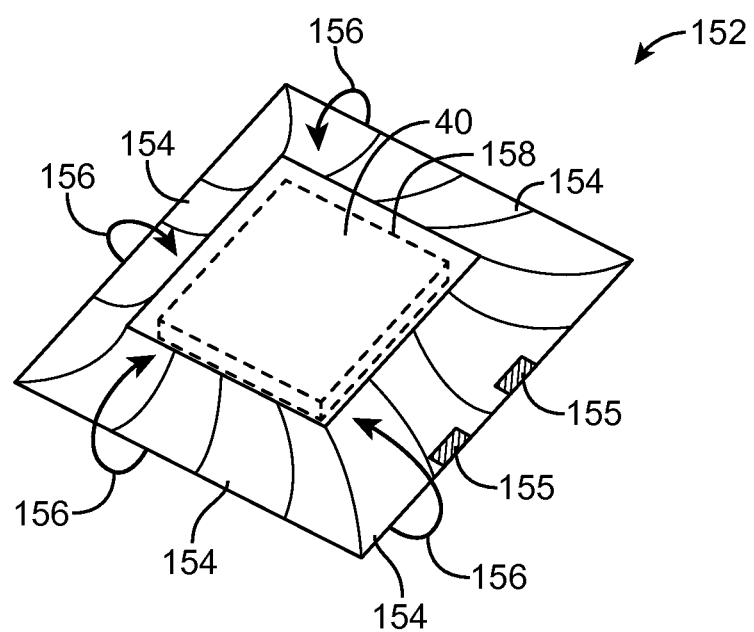
FIG. 16 is a perspective view of a battery sleeve that encloses a battery showing how peripheral portions of the battery sleeve may be folded and attached to a center portion of the battery sleeve in accordance with an embodiment of the present invention.

A battery such as battery 40 in electronic device 10 may be enclosed in a protective sleeve. FIG. 16 is an illustrative perspective view of a protective sleeve 152 that encloses battery 40. Protective sleeve 152 may be sealed around the periphery of battery 40. For example, peripheral regions 154 around battery 40 may be sealed to protect battery 40. Protective sleeve 152 may include contacts such as contacts 155 for conveying battery signals (e.g., to electronic device circuitry).

To help reduce the footprint of battery 40, peripheral regions 154 of sleeve 152 may be folded inward (e.g., towards battery 40) as shown by arrows 156. Peripheral regions 154 may be attached to center portion 158 of sleeve 152 without increasing the combined height of battery 40 and sleeve 152.

Figure 17:
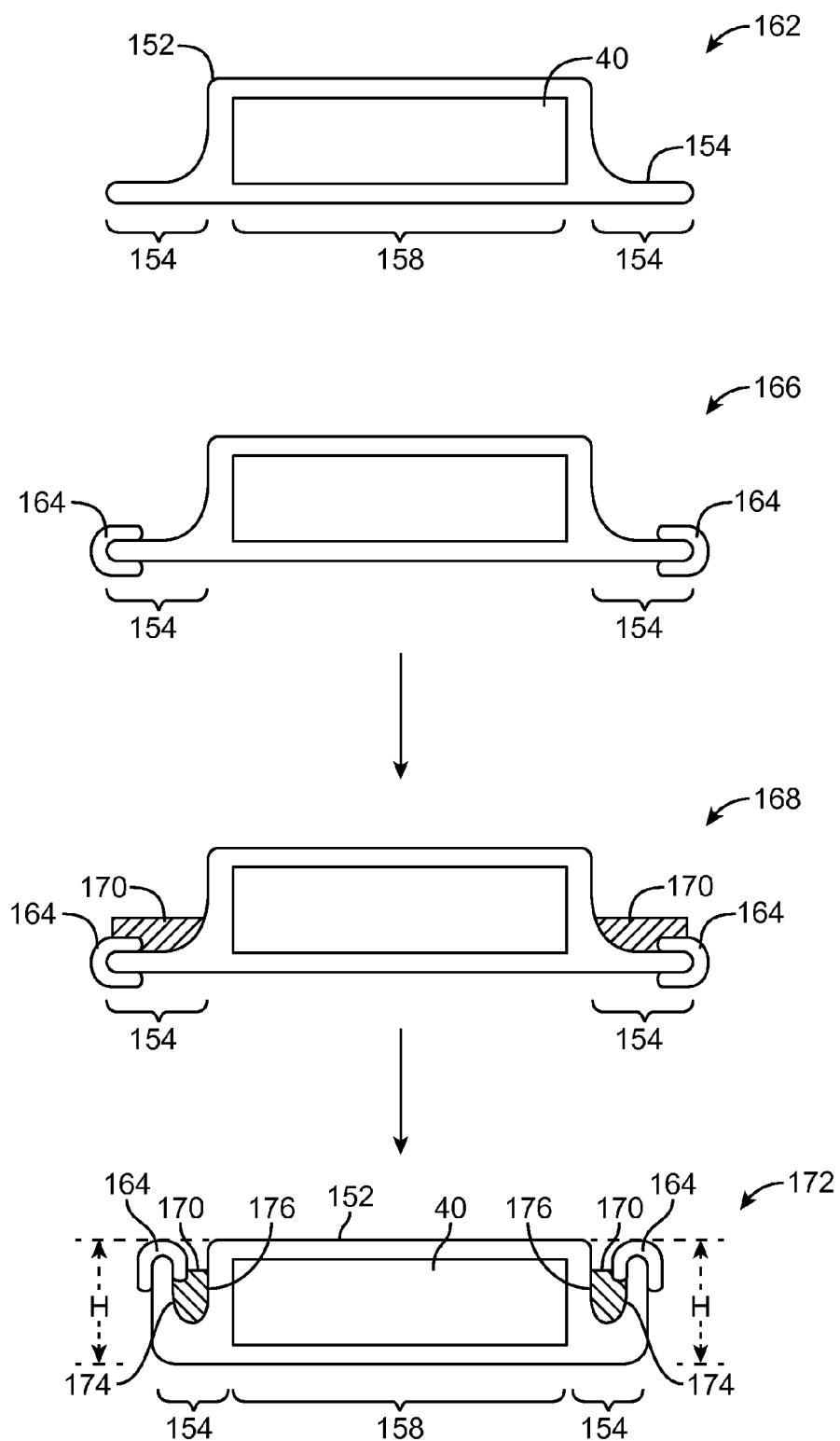
FIG. 17 is a diagram of illustrative steps that may be performed to attach peripheral portions of a battery sleeve to a center portion of the battery sleeve in accordance with an embodiment of the present invention.

FIG. 17 is a cross-sectional diagram of illustrative steps that may be performed to attach peripheral regions 154 of battery sleeve 152 to center portion 158. A battery 40 enclosed in a battery sleeve 152 may be initially provided at step 162.

During the operations of step 166, an adhesive layer 164 may be deposited over peripheral regions 154 of battery sleeve 152. Adhesive layer 164 may be formed from an insulating material. Adhesive layer 164 may, for example, include a layer of tape formed from an insulating material such as polyimide or other insulating materials.

During the operations of step 168, an additional adhesive material 170 may be deposited over the upper surface of peripheral regions 154. Adhesive material 170 may include tape, glue, or other adhesive materials. Adhesive material 170 may be formed from insulating materials. As examples, adhesive material 170 may include double-sided tape or pressure-sensitive adhesives.

During the operations of step 172, peripheral regions 154 of battery sleeve 152 may be folded upwards to center portion 158 of sleeve 152. Peripheral regions 154 may be attached to center portion 158 via adhesive materials 170 and 164. Adhesive materials 170 and 164 may be interposed between opposing surfaces 176 and 174 of center portion 158 and peripheral regions 154, respectively. By attaching peripheral regions 154 to center portion 158 using adhesive materials 170 and 164 that are interposed between opposing surfaces 174 and 176, the footprint of battery sleeve 152 may be reduced without increasing combined height H of sleeve 152 and battery 40.

The example of FIG. 17 in which multiple adhesive layers are used to attach peripheral regions 154 to center portion 158 of battery sleeve 152 is merely illustrative. If desired, one or more adhesive layers may be used to attach peripheral regions 154 to center portion 158 without increasing combined height H.

The foregoing is merely illustrative of the principles of this invention and various modifications can be made by those skilled in the art without departing from the scope and spirit of the invention. The foregoing embodiments may be implemented individually or in any combination.

What is claimed is:

1. A printed circuit board, comprising:
    a substrate;
    an electronic component mounted to the substrate, wherein the electronic component has a first height;
    a conductive fence surrounding the electronic component on the substrate, wherein the conductive fence has a second height that is lower than the first height; and
    a flexible electromagnetic shielding layer that covers the electronic component and the conductive fence.

2. The printed circuit board defined in claim 1 wherein the flexible electromagnetic shielding layer comprises a layer of metal foil.

3. The printed circuit board defined in claim 1 wherein the flexible electromagnetic shielding layer comprises a layer of conductive fabric.

4. The printed circuit board defined in claim 1 wherein the conductive fence comprises a metal fence.

5. The printed circuit board defined in claim 1 wherein the flexible electromagnetic shielding layer is coupled to the conductive fence by a layer of adhesive material.

6. The printed circuit board defined in claim 1 wherein the flexible electromagnetic shielding layer is coupled to the conductive fence by solder.

7. The printed circuit board defined in claim 1 wherein the fence includes protruding ledges to which the flexible electromagnetic shielding layer is attached.

8. The printed circuit board defined in claim 7 wherein the protruding ledges include upper and lower surfaces and wherein the flexible electromagnetic shielding layer is attached to the upper surface of the protruding ledges.

9. The printed circuit board defined in claim 7 wherein the protruding ledges include upper and lower surfaces and wherein the flexible electromagnetic shielding layer is attached to the lower surface of the protruding ledges.

10. The printed circuit board defined in claim 9 wherein the flexible electromagnetic shielding layer is attached to the lower surface of the protruding ledges by a welded connection through a sacrificial metal layer on a portion of the flexible electromagnetic shielding layer.

11. The printed circuit board defined in claim 1 further comprising:
    an additional electronic component mounted to the substrate having a third height that is lower than the second height, wherein conductive fence surrounds the additional electronic component and wherein the flexible electromagnetic shielding layer covers the additional electronic component.

12. The printed circuit board defined in claim 11 wherein the fence includes a first fence portion having the third height and a second fence portion having the second height.

13. An electronic device, comprising:
    a battery;
    circuitry; and
    an electromagnetic shielding structure having a recess that receives a portion of the battery, wherein the electromagnetic shielding structure encloses the circuitry.

14. The electronic device defined in claim 13 wherein the electromagnetic shielding structure comprises a shielding layer that covers the circuitry, wherein the shielding layer includes a flexible portion that forms part of the recess and a rigid portion.

15. The electronic device defined in claim 14 wherein the flexible portion comprises a conductive fabric.

16. The electronic device defined in claim 14 wherein the flexible portion comprises a metal foil.

17. The electronic device defined in claim 14 wherein the electromagnetic shielding structure further comprises a conductive fence that surrounds the circuitry, wherein the rigid portion is coupled to the conductive fence and wherein the flexible portion is attached to the rigid portion and the conductive fence.

18. The electronic device defined in claim 17 wherein the rigid portion of the shielding layer includes at least one opening that is covered by the flexible portion of the shielding layer and wherein the portion of the battery that is received by the recess comprises a protruding portion of the battery.

19. The electronic device defined in claim 18 wherein the circuitry includes an electronic component within the opening of the rigid portion of the shielding layer and wherein the electronic component is covered by the flexible portion of the shielding layer.

20. An electronic device, comprising:
    a switch;
    a button member operable to actuate the switch;
    a housing having an integral ledge to which the switch is mounted.

21. The electronic device defined in claim 20 wherein the housing comprises a metal housing and wherein the integral ledge comprises a machined ledge formed from a portion of the metal housing.

22. The electronic device defined in claim 21 further comprising a bracket mounted to the machined ledge, wherein the switch is mounted to the bracket.

23. The electronic device defined in claim 22 wherein the housing includes an opening that faces the machined ledge and wherein the button member protrudes from the electronic device through the opening in the housing.

24. The electronic device defined in claim 23 wherein the machined ledge includes a trench and wherein the bracket includes a protruding portion that mates with the trench.

25. The electronic device defined in claim 21 wherein the bracket is mounted to the machined ledge by a screw.

26. Electronic device battery structures, comprising:
a battery; and
a protective battery sleeve having a center portion that encloses the battery and folded peripheral portions that are coupled to the center portion by adhesive material interposed between opposing surfaces of the folded peripheral portions and the center portion.

27. The electronic device battery structures defined in claim 26 wherein the adhesive material interposed between the opposing surfaces of the folded peripheral portions and the center portion comprises adhesive tape.

28. The electronic device battery structures defined in claim 26 wherein the adhesive material interposed between the opposing surfaces of the folded peripheral portions and the center portion comprises glue.

29. The electronic device battery structures defined in claim 26 wherein the adhesive material interposed between the opposing surfaces of the folded peripheral portions and the center portion comprises a pressure sensitive adhesive.

30. The electronic device battery structures defined in claim 26 wherein the folded peripheral portions of the protective battery sleeve surround the center portion of the protective battery sleeve.

* * * * *